United States Patent
Aswell et al.

(10) Patent No.: US 8,274,051 B1
(45) Date of Patent: Sep. 25, 2012

(54) METHOD AND DEVICE FOR OPTOELECTRONIC SENSORS WITH IR BLOCKING FILTER

(75) Inventors: Cecil Aswell, Orangevale, CA (US); Eugene G. Dierschke, Dallas, TX (US)

(73) Assignee: Texas Advanced Optoelectronic Solutions, Inc., Plano, TX (US)

( * ) Notice: Subject to any disclaimer, the term of this patent is extended or adjusted under 35 U.S.C. 154(b) by 0 days.

(21) Appl. No.: 13/097,420

(22) Filed: Apr. 29, 2011

(51) Int. Cl.
  *G01J 5/02* (2006.01)
  *H01L 27/14* (2006.01)
(52) U.S. Cl. .............. 250/339.05; 250/338.4; 250/341.5
(58) Field of Classification Search .............. 250/338.1, 250/338.4, 339.05, 341.5, 339.01, 339.02, 250/340
See application file for complete search history.

(56) References Cited

U.S. PATENT DOCUMENTS

| | | | | |
|---|---|---|---|---|
| 4,956,555 | A | * | 9/1990 | Woodberry ............... 250/339.02 |
| 6,596,981 | B1 | * | 7/2003 | Aswell et al. .............. 250/214.1 |
| 7,435,943 | B1 | | 10/2008 | Chen et al. |
| 7,572,077 | B2 | | 8/2009 | Lapstun et al. |
| 7,855,426 | B2 | | 12/2010 | Haag et al. |
| 7,864,233 | B2 | | 1/2011 | Kwon et al. |
| 2010/0252871 | A1 | | 10/2010 | Kalnitsky et al. |
| 2010/0282953 | A1 | | 11/2010 | Tam |

OTHER PUBLICATIONS

Data sheet for TCS3404, TCS3414 Digital Color Sensors; Texas Advanced Optoelectronic Solutions; Apr. 2011; 40 pgs.
Data sheet for TCS3404CS, TCS3414CS Digital Color Light Sensors; Texas Advanced Optoelectronic Solutions; Oct. 2009; 38 pgs.

\* cited by examiner

*Primary Examiner* — David Porta
*Assistant Examiner* — Carolyn Igyarto
(74) *Attorney, Agent, or Firm* — Howison & Arnott, L.L.P.

(57) ABSTRACT

Semiconductor structures for optoelectronic sensors with an infrared (IR) blocking filter and methods for using such sensors with post-detection compensation for IR content that passes through the IR blocking filter are provided herein.

22 Claims, 8 Drawing Sheets

METHOD AND DEVICE FOR OPTOELECTRONIC SENSORS WITH IR BLOCKING FILTER

BACKGROUND

Integrated circuits (ICs) may include various components for use in applications such as optical sensing applications. One such component is a silicon based optoelectronic sensor used to detect light. The optoelectronic sensor produces a representation (e.g., an electrical signal) of the detected light that may then be processed and used as desired. Due to limitations in current optoelectronic sensors, improvements are needed.

BRIEF DESCRIPTION OF THE DRAWINGS

For a more complete understanding, reference is now made to the following description taken in conjunction with the accompanying Drawings in which.

DETAILED DESCRIPTION

Figure 1:
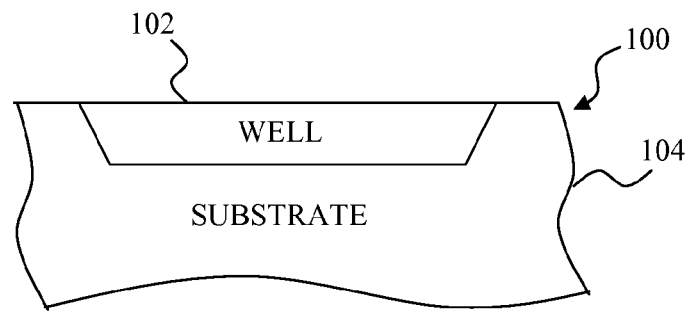
FIG. 1 illustrates one embodiment of a semiconductor structure that may be used as an optoelectronic sensor.

The present disclosure is directed to methods and semiconductor devices for light detection. It is understood that the following disclosure provides many different embodiments or examples. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, one embodiment of an optoelectronic sensor 100 is provided as a semiconductor structure having a well 102 positioned on or within a substrate 104. The sensor 100 is configured to detect light (e.g., as a photodetector) and to generate a sensor response (e.g., a photocurrent) based on the detected light. The sensor 100 may detect light of varying wavelengths for many different applications, such as presence detection, motion detection, color detection, and ambient light sensing (ALS) applications. For example, the sensor 100 may be configured to detect light in the visible light spectrum and/or the infrared (IR) spectrum, including light generated specifically for detection by the sensor 100 (e.g., by a light emitting diode (LED) or another device) and/or light present in the environment (e.g., ambient light).

For purposes of illustration, the well 102 is formed in the substrate 104 using CMOS fabrication technology or any other appropriate technology. For example, the well 102 may be an N-type well formed in a P− epitaxial (epi) layer that is itself formed on a P+ substrate. It is understood that many different configurations of wells, layers, and substrates may be used to provide the sensor 100, and the different configurations may have different doping types, well structures, and layers. Furthermore, it is understood that multiple wells 102 may be present in embodiments where the sensor 100 represents multiple sensors. For example, if the sensor 100 represents two separate sensors, two wells 102 may be present, with one well 102 representing one sensor 100.

Accordingly, the term "sensor" is used in following embodiments to refer to a semiconductor structure designed to detect light and is not limited to a particular physical configuration. The spectral response of the silicon semiconductor structure that may be used for the sensor 100 is a range of wavelengths from approximately 300 nanometers (nm) to 1100 nm. The sensor 100 generates the sensor response when it detects light in its spectral response range.

In various applications, it is desirable to use the sensor 100 to mimic a photopic response, which is the human eye's response to light. For example, an ALS application frequently attempts to mimic the photopic response in order to make adjustments based on the amount of ambient light being received by the device on which the application is running. However, sensors that are silicon based (such as the sensor 100) are generally sensitive not only to the light visible to the human eye, but also to light of other wavelengths that are not detectable by the human eye, such as infrared light. This complicates the problem of correctly identifying the photopic response because the output of the sensor 100 will reflect both the visible and non-visible components of light received by the sensor.

One approach used to mimic a photopic response is to use a compensation process that relies on multiple sensors, such as are detailed in U.S. Pat. No. 6,596,981, filed on Jan. 14, 2002, and entitled METHOD AND APPARATUS FOR OPTICAL DETECTOR WITH SPECTRAL DISCRIMINATION, and U.S. patent application Ser. No. 12/425,530, filed on Apr. 17, 2009, and entitled AMBIENT LIGHT SENSOR, both of which are incorporated herein by reference in their entirety. The approaches described therein use the separate responses of two or more sensors to compensate for non-visible light when calculating the photopic response.

While post-detection compensation processes are effective in many different applications, certain limitations may apply. For example, because the sensor response is based on all detected light in the sensor's spectral response range, higher levels of IR light in the detected light will generate a larger sensor response than lower levels of IR light. In other words, the detection of IR light plus a fixed amount of visible light results in a larger sensor response than the detection of a lower amount of IR light plus the fixed amount of visible light. The larger response means that a compensation process must deal with a larger value for the detected light, and larger values generally have a greater margin of error in calculations than smaller values. For example, if the compensation process subtracts one sensor response from another sensor response, the use of larger values in the subtraction process will generally result in greater variation of the difference (due to system variables) compared to the subtraction of two smaller values. Accordingly, higher levels of IR light in a sensor response may diminish the accuracy of post-detection compensation calculations due to the increased margin of error introduced by larger values. In addition, high levels of IR light may saturate the sensors 100 in some environments, making it more difficult to accurately calculate the photopic response. For example, a high level of IR light may push the sensor into saturation, thereby limiting the sensor's dynamic range.

Figure 2:
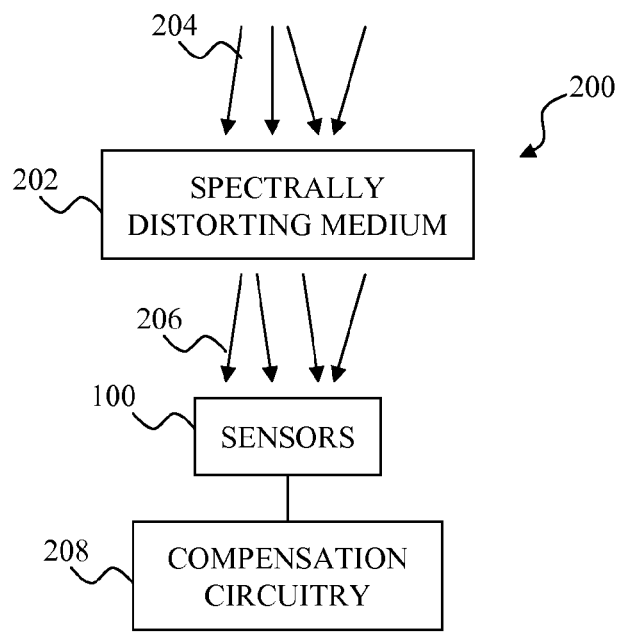
FIG. 2 is a simplified diagram of an environment with sensors of FIG. 1 and a spectrally distorting medium positioned between the sensors and the environment.

Referring to FIG. 2, in one embodiment, an environment 200 is illustrated in which sensors 100 are illustrated with a spectrally distorting medium 202 positioned between the sensors 100 and light 204 from the environment. The light 204 from the environment passes through the spectrally distorting medium 202 before reaching the sensors 100 as spectrally distorted light 206. The spectrally distorting medium 202 creates a spectral distortion in the light 206 that reaches the sensors 100 by blocking at least a portion of particular wavelengths of the incoming light 204 from reaching the sensors 100 but passing the remaining wavelengths of the light 206. For example, the spectrally distorting medium 202 may attenuate light in the visible spectrum, but may pass light in the IR spectrum with little or no attenuation.

It is understood that the wavelengths of light that are attenuated by the spectrally distorting medium 202 depend on the characteristics of the material(s) forming the spectrally distorting medium 202. For example, the spectrally distorting medium 202 may be a cell phone faceplate or a television monitor bezel used for aesthetic and/or other purposes to block visible light (e.g., to hide the sensor from a user's view). However, the faceplate or bezel may be constructed to allow infrared light to pass through for purposes such as signaling (e.g., a television remote control), proximity detection, motion detection, or simply because IR attenuation is not part of the design. The spectrally distorting medium 202 may be glass, plastic, or any other material or combination of materials, may be a single layer or multiple layers, and may be tinted or clear. In the present example, the spectrally distorting medium 202 is not part of the sensors 100, but may be in some embodiments.

In cases where the spectrally distorting medium 202 attenuates at least some visible light wavelengths but not IR light wavelengths, the spectral distortion may complicate attempts to mimic a photopic response to the light 204. More specifically, in cases where the spectrally distorting medium 202 is used, a relatively high percentage of the visible light component of the light 204 may be blocked and therefore not detected by the sensors 100, while a relatively high percentage of the infrared light component of the light 204 may reach the sensors 100. This increase in the percentage of IR light relative to visible light in the light 206 may negatively impact the accuracy of post-detection compensation calculations as described previously.

It is understood that the attenuation caused by the spectrally distorting medium 202 across the visible spectrum may not be uniform. For example, ninety percent of the visible light wavelengths in the blue color range may be attenuated (i.e., ten percent may pass through to the sensor 100) while ninety-five percent of the visible light wavelengths in the green color range may be attenuated (i.e., five percent may pass through to the sensors 100). In such an example, the spectrally distorting medium 202 may pass eighty-five percent of the IR wavelengths. Another example may be a spectrally distorting medium 202 that is substantially transparent in infrared but blocks ninety-five percent or more of the visible spectrum. Accordingly, there are many different cases of spectral distortion that may be presented to the sensor 100.

With continued reference to FIG. 2, compensation circuitry 208 is coupled to the sensors 100 to perform one or more post-detection compensation processes. Although shown as separate from the sensors 100, the compensation circuitry 208 may be integral therewith in some embodiments. For example, the compensation circuitry 208 may be formed with the sensors 100 on an integrated circuit (IC) during a manufacturing process. Alternatively, the compensation circuitry may be partially or wholly separate (e.g., may be one or more separate ICs). In some embodiments, the compensation circuitry 208 may include a controller that is configured to execute instructions.

Although it is understood that the compensation circuitry 208 may compensate for many different spectral distortion scenarios and is not limited to compensating for IR light, IR light is used for purposes of example. Accordingly, the compensation circuitry 208 uses sensor responses received from the sensors 100 and performs one or more calculations to minimize the IR component that remains in the detected light after IR filtering occurs. The compensation circuitry 208 may receive a single output from multiple sensors 100 or may receive a single output that represents multiple sensor responses. The compensation circuitry 208 may be configured to perform subtraction and/or other relatively simple operations for compensation purposes (e.g., as described with respect to U.S. patent application Ser. No. 12/425,530), or may include various components and perform more complicated compensation operations (e.g., as described with respect to U.S. Pat. No. 6,596,981).

While compensation processes performed by the compensation circuitry 208 may be generally effective for typical light sources such as incandescent, fluorescent, and halogen lamps that have variations in IR light content, the introduction of the spectrally distorting medium 202 may lessen the accuracy of such processes. Furthermore, while increasing the sensitivity of the sensors 100 for a particular spectral distortion scenario might aid in approximating a photopic response, variations in manufacturing processes may make this difficult. These variations may be caused by sensitivity differences between individual sensors or batches of sensors created by such processes. Furthermore, calibrating each sensor 100 or sensor array after manufacture is generally not desirable due to the time and cost of such calibration procedures.

Accordingly, an IR blocking filter may be used in conjunction with a post-detection compensation process, such as one of the approaches described in previously incorporated U.S. Pat. No. 6,596,981 and U.S. patent application Ser. No. 12/425,530. The IR blocking filter may be used to reduce the amount of IR light remaining after the light passes through the spectrally distorting medium 202. A compensation process may then be applied to account for IR light remaining in the detected light. It is understood that the combination of an IR blocking filter and a post-detection compensation process may also be used when there is no spectrally distorting medium 202. Furthermore, it is understood that many different compensation processes may be used and the present disclosure is not limited to the compensation processes referenced herein.

Figure 3:
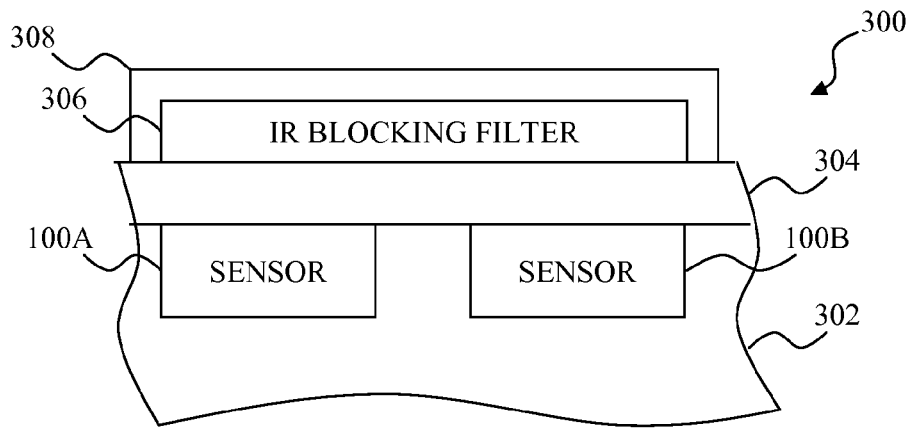
FIG. 3 illustrates one embodiment of a semiconductor device with two sensors of FIG. 1 and an infrared (IR) blocking filter positioned above both sensors.

Referring to FIG. 3, one embodiment of a semiconductor device 300 that may be used to detect the light 206 of FIG. 2 for later compensation processing is illustrated. The semiconductor device 300 includes sensors 100A and 100B in a substrate 302. The sensors 100A and 100B may be similar or identical to the sensor 100 of FIG. 1, and the substrate 302 may be the substrate 104 of FIG. 1 or a different substrate. A semiconductor layer 304 (e.g., an oxide or nitride layer) may cover the sensors 100A and 100B. The layer 304 may not be present in all embodiments, and may represent multiple layers of the same or different materials. An IR blocking filter 306 is positioned above the sensors 100A and 100B (e.g., between the sensors 100A/100B and the environment). In the present embodiment, the IR blocking filter 306 is integral and formed directly on the layer 304 above the sensors 100A/100B. In other embodiments, the IR blocking filter 306 may be separate and not integral to the device 300.

The IR blocking filter 306 may include approximately fifty different planar layers (not shown) that together form an IR blocking filter that is approximately four microns high. However, it is understood that different numbers of layers and thicknesses may be used for the IR blocking filter 306. Furthermore, the IR blocking filter 306 may be of varying area sizes. For example, the IR blocking filter 306 may cover more or less area than the sensors 100A and 100B, or may cover an identical area. Although shown as a single IR blocking filter 306, it is understood that each sensor 100A and 100B may be associated with its own IR blocking filter.

The IR blocking filter 306 may prevent a significant portion of the IR light from reaching the sensors 100A/100B, but may be unable to block all of the IR light. For example, the IR blocking filter 306 may block fifty percent or more of the IR light. However, even if the IR blocking filter 306 blocks substantially all (e.g., ninety-five percent) of the IR light, some IR light will reach the sensors 100A/100B. When combined with the attenuated visible light reaching the sensors 100A/100B due to the spectrally distorting medium 202 as illustrated in FIG. 2, the responses produced by the sensors 100A/100B may be similar or identical to that of unfiltered sensors. For example, if the spectrally distorting medium 202 blocks ninety-five percent of the visible light component of the light 204 (FIG. 2) and the IR blocking filter 306 blocks ninety-five percent of the IR light component of the light 206, the ratio of visible light and IR light reaching the sensors 100A/100B in the light 206 will be substantially the same as if no blocking was occurring. In some embodiments, the IR blocking filter 306 may attenuate visible light as well as IR light.

A sealant layer 308 may be present above the IR blocking filter 306. The sealant layer 308, which is clear in the present example, may provide mechanical protection, chemical protection, and/or moisture protection for underlying layers. In other embodiments, the sealant layer 308 may provide additional or alternative functions. In the present example, the sealant layer 308 completely covers the IR blocking filter 306 and contacts the layer 304 all around the IR blocking filter 306, but in other embodiments one or more gaps may be present in the sealant layer 308. In the present example, the sealant layer 308 is formed of a material that allows visible and IR light to pass through with little or no attenuation. In other embodiments, the sealant layer 308 may be designed to attenuate selected wavelengths of light (e.g., as an IR filter or a visible light filter).

The layer 304 and/or sealant layer 308 may be present in all embodiments described in the present disclosure, but are omitted from many Figures for purposes of clarity. Accordingly, while the layer 304 and/or the sealant layer 308 may not be shown in a particular embodiment, it is understood that the layer 304 and/or the sealant layer 308 may be incorporated therein. In embodiments having a visible light filter (described below), the layer 304 and/or the sealant layer 308 may be positioned over or under the visible light filter.

Figure 4:
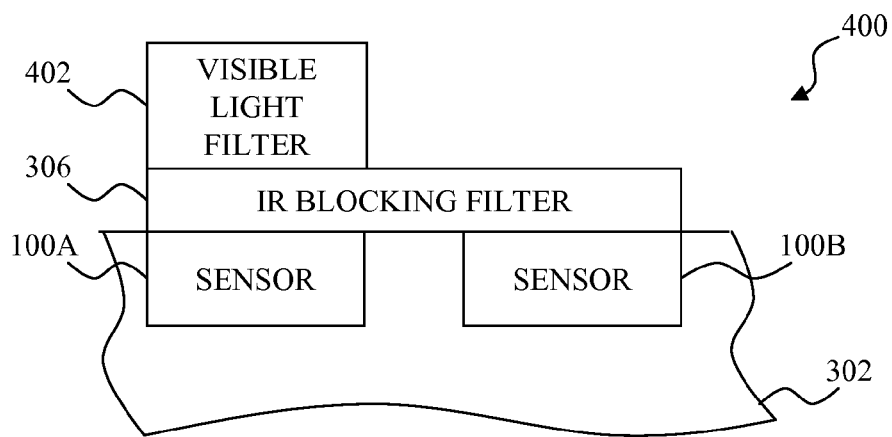
FIG. 4 illustrates one embodiment of a semiconductor device such as the semiconductor device of FIG. 3 with a visible light filter positioned above one of the sensors.

Referring to FIG. 4, one embodiment of a semiconductor device 400 is illustrated that may be similar or identical to the semiconductor device 300 of FIG. 3 with the addition of a visible light filter 402. The visible light filter 402 is designed to attenuate visible light based on the configuration of the visible light filter 402. For example, the visible light filter 402 may be a color filter and may include one or more low pass, band pass, and high pass filters configured to attenuate some visible light wavelengths while passing other visible light wavelengths. As a color filter, visible light filter 402 may be configured as a single filter (e.g., a red filter layer) or may be configured as a stack of two or more filter layers (e.g., a red filter layer positioned under a blue filter layer).

The visible light filter 402 may include or be formed from a material such as plastic that is capable of blocking ultraviolet (UV) wavelengths, and/or a material such as a metal that is capable of blocking IR wavelengths, and/or using photonic crystal structures. In some embodiments, the visible light filter 402 may be configured to block all visible light. When so configured, the visible light filter 402 may or may not block IR and/or UV light. For example, the visible light filter 402 may be a material as described with respect to previously incorporated U.S. Pat. No. 6,596,981. In such cases, the visible light filter 402 would be configured to filter all visible light wavelengths and the sensors 100A and 100B may be used as described in previously incorporated U.S. Pat. No. 6,596,981. Accordingly, the materials and structure of the visible light filter 402 may vary in order to accomplish a particular desired filtering result with visible light wavelengths.

As there is no visible light filter above the sensor 100B, the sensor 100B may be a visible light sensor such as a clear color sensor used for sensing all incoming light (e.g., with no visible light blocking other than that provided by the spectrally distorting medium 202). Accordingly, sensor 100B may be used with the sensor 100A for compensation processes based on the different responses of the two sensors.

Although the IR blocking filter 306 is described and illustrated in the present and following embodiments as being located under the visible light filter 402, it is understood that the IR blocking filter 306 may be located above the visible light filter 402 in any of the embodiments. The illustrated vertical arrangement enables a single IR blocking filter to be deposited across multiple sensors and then individual visible light filters to be deposited for each sensor. Generally, the IR blocking filter 306 may be deposited on the layer 304 because it may be desirable that the layers forming the IR blocking filter 306 are flat and depositing these layers on the layer 304, rather than on multiple visible light filters, may be preferable given available manufacturing processes. However, the IR blocking filter 306 (or multiple IR blocking filters) may be positioned above the visible light filters to achieve the results described herein. Such variations in positioning may be chosen based on available manufacturing processes, performance testing, selected materials, and similar criteria. Accordingly, while not shown, it is understood that the IR blocking filter 306 may be positioned above the visible light filter 402, and that other layers may be present between the IR blocking filter 306 and the visible light filter 402.

Figure 5:
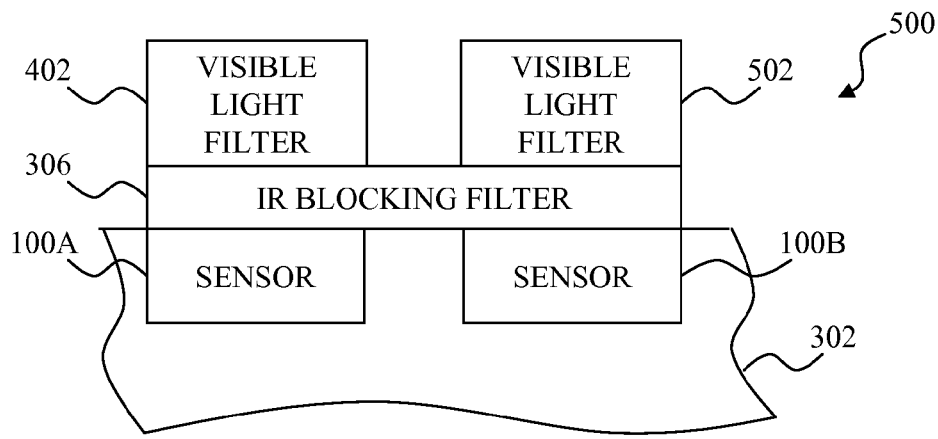
FIG. 5 illustrates one embodiment of a semiconductor device such as the semiconductor device of FIG. 4 with a visible light filter positioned above each sensor.

Referring to FIG. 5, one embodiment of a semiconductor device 500 is illustrated that may be similar or identical to the semiconductor device 400 of FIG. 4 with a visible light filter 502 positioned over the sensor 100B. More specifically, the visible light filter 402 is formed over the IR blocking filter 306 and sensor 100A, and the visible light filter 502 is formed over the IR blocking filter 306 and the sensor 100B. The visible light filter 502 may be similar or identical to the visible light filter 402, and may block the same, different, or overlapping wavelengths of visible light.

The sensor 100B may be a color sensor used for sensing particular wavelengths of incoming visible light (e.g., based on the properties of the visible light filter 502) and/or may be used for IR sensitive applications such as proximity or motion detection with the visible light filter 502 configured to improve the performance of IR detection. For example, the visible light filter 502 may be a red filter layer, a blue filter layer, or a stack containing both red and blue filter layers. The addition of a green filter layer in the visible light filter 502 may negatively impact IR detection functionality of the sensor 100B and so may be avoided in some embodiments.

Figure 6:
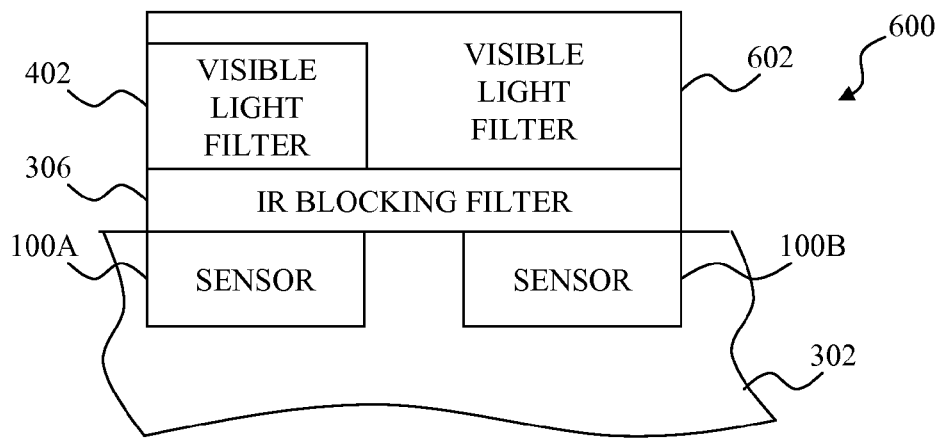
FIG. 6 illustrates one embodiment of a semiconductor device such as the semiconductor device of FIG. 5 with a visible light filter positioned above both sensors.

Referring to FIG. 6, one embodiment of a semiconductor device 600 is illustrated that may be similar or identical to the semiconductor device 500 of FIG. 5 with a visible light filter 602 positioned over both the sensors 100A and 100B. The visible light filter 602 may be a single filter layer that is formed over the IR blocking filter 306 and both of the sensors 100A/100B as shown. The visible light filter 602 may be similar or identical to the visible light filter 402, and may block the same, different, or overlapping wavelengths of visible light. In some embodiments, one of the visible light filters 402 and 602 may be yellow or green, and the other may be red or amber as described in previously incorporated U.S. patent application Ser. No. 12/425,530. It is understood that any of the visible light filters described herein may be formed as one or more layers over multiple sensors, and may be positioned either under or above other visible light filters.

Figure 7:
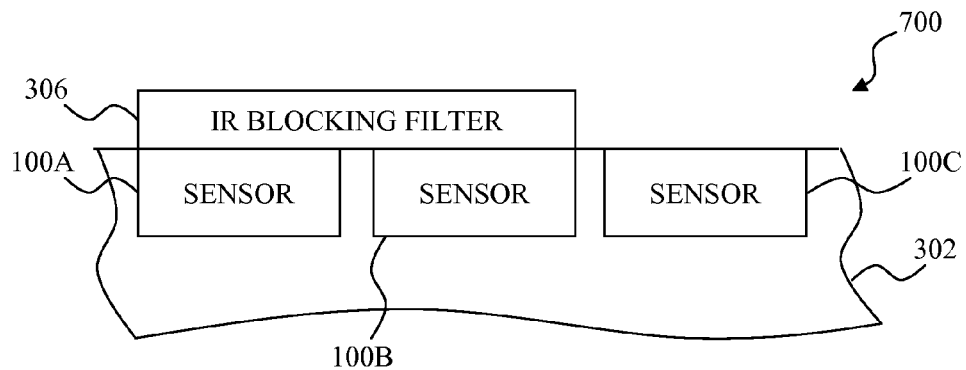
FIG. 7 illustrates one embodiment of a semiconductor device such as the semiconductor device of FIG. 3 with a sensor that is not covered by the IR blocking filter.

Referring to FIG. 7, one embodiment of a semiconductor device 700 is illustrated that may be similar or identical to the semiconductor device 300 of FIG. 3 with another sensor 100C. The IR blocking filter 306 does not cover the sensor 100C, and so light detected by the sensor 100C contains more IR content than light detected by the sensors 100A/100B.

The sensor 100C may be used for an application such as proximity sensing or motion detection. For example, an LED emitter (not shown) may be used to emit an IR signal that is reflected off a subject in the environment and detected by the sensor 100C. Filtering of the IR signal by the IR blocking filter 306 reduces the incoming IR signal and therefore negatively affects the detection of IR light needed for proximity sensing, motion detection, or other IR sensitive applications. By positioning the IR blocking filter 306 above the sensors 100A/100B but not the sensor 100C, applications (e.g., color sensing or photopic response applications) using the sensors 100A/100B can benefit from the reduced IR without impacting the IR sensitive applications that may use the sensor 100C. Accordingly, in this and following embodiments, sensors not covered by the IR blocking filter 306 may be used for applications that benefit from a higher level of incoming IR light than sensors covered by the IR blocking filter 306. Alternatively or additionally, the sensor 100C may be used to detect unfiltered IR light for use in post-detection IR compensation processes.

Figure 8:
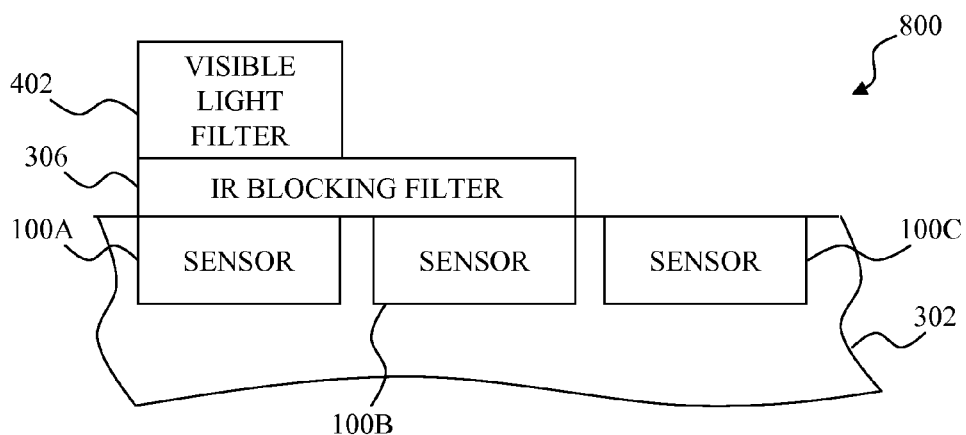
FIG. 8 illustrates one embodiment of a semiconductor device such as the semiconductor device of FIG. 7 with a visible light filter positioned above one sensor that is under the IR blocking filter.

Referring to FIG. 8, one embodiment of a semiconductor device 800 is illustrated that may be similar or identical to the semiconductor device 700 of FIG. 7 with the visible light filter 402 positioned above the sensor 100A. The visible light filter 402 enables filtering of the visible light reaching the sensor 100A while not affecting the visible light detection of the sensors 100B and 100C.

Figure 9:
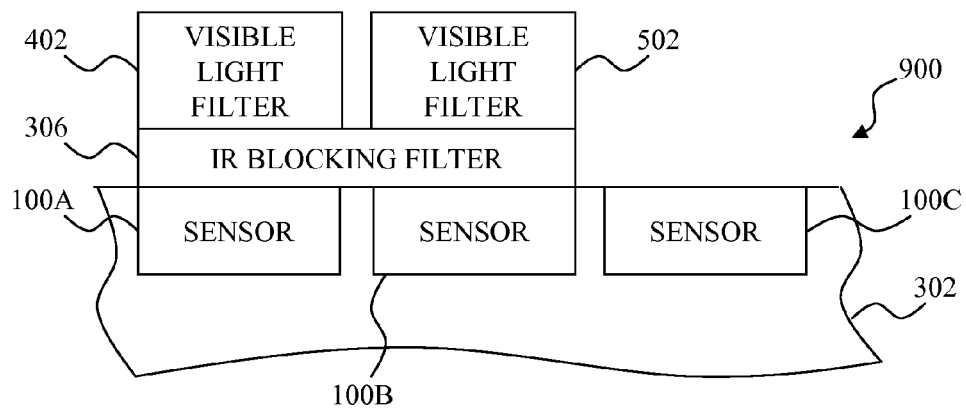
FIG. 9 illustrates one embodiment of a semiconductor device such as the semiconductor device of FIG. 10 with a visible light filter positioned above both sensors that are under the IR blocking filter.

Referring to FIG. 9, one embodiment of a semiconductor device 900 is illustrated that may be similar or identical to the semiconductor device 800 of FIG. 8 with the visible light filter 402 positioned above the sensor 100A and the visible light filter 502 positioned above the sensor 100B. There is no visible light filter positioned above the sensor 100C.

Figure 10:
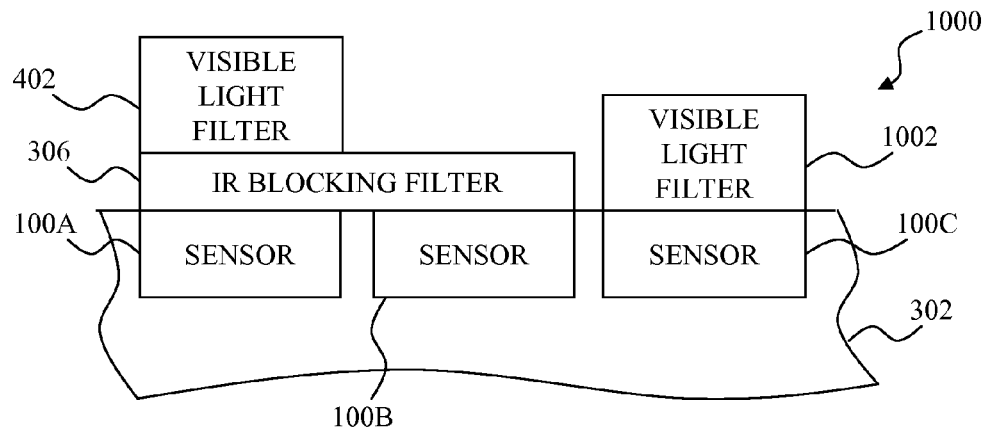
FIG. 10 illustrates one embodiment of a semiconductor device such as the semiconductor device of FIG. 8 with a visible light filter positioned above the sensor that is not under the IR blocking filter.

Referring to FIG. 10, one embodiment of a semiconductor device 1000 is illustrated that may be similar or identical to the semiconductor device 900 of FIG. 9 with the visible light filter 402 positioned above the sensor 100A and a visible light filter 1002 positioned above the sensor 100C. The visible light filter 1002 may be similar or identical to the visible light filter 402, and may block the same, different, or overlapping wavelengths of visible light. There is no visible light filter positioned above the sensor 100B.

In some embodiments, the visible light filter 402 as illustrated in FIG. 10 may be designed to block all visible light from the sensor 100A. For example, the visible light filter 402 may be a material as described with respect to previously incorporated U.S. Pat. No. 6,596,981. In such cases, the visible light filter 402 would be configured to filter all visible light wavelengths and the sensors 100A and 100B would be used as described in previously incorporated U.S. Pat. No. 6,596,981.

The sensor 100C may be a color sensor used for sensing particular wavelengths of incoming visible light (e.g., based on the properties of the visible light filter 1002) and/or may be used for IR sensitive applications such as proximity or motion detection with the visible light filter 1002 configured to improve the performance of IR detection. For example, the visible light filter 1002 may be a red filter layer, a blue filter layer, or a stack containing both red and blue filter layers. The addition of a green filter layer in the visible light filter 1002 may negatively impact IR detection functionality of the sensor 100C and so may be avoided in some embodiments.

Figure 11:
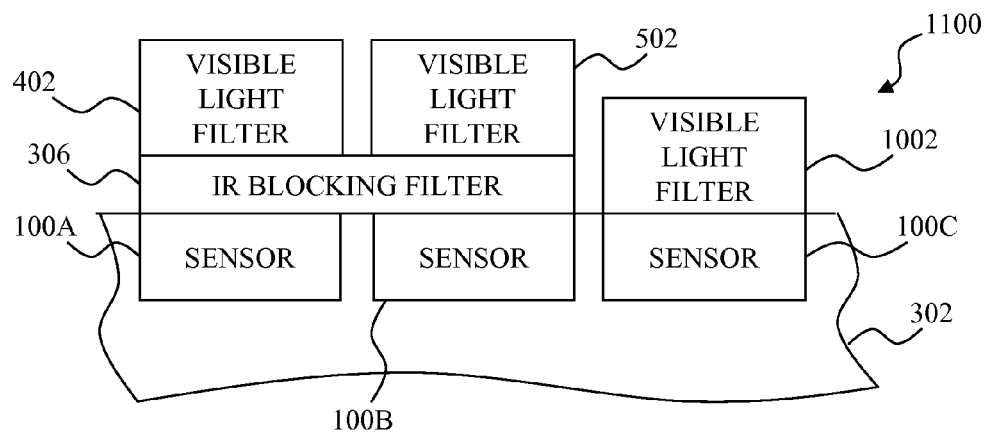
FIG. 11 illustrates one embodiment of a semiconductor device such as the semiconductor device of FIG. 8 with a visible light filter positioned above each of the sensors.

Referring to FIG. 11, one embodiment of a semiconductor device 1100 is illustrated that may be similar or identical to the semiconductor device 1000 of FIG. 10 with the visible light filter 402 positioned above the sensor 100A, the visible light filter 502 positioned above the sensor 100B, and the visible light filter 1002 positioned above the sensor 100C.

Figure 12:
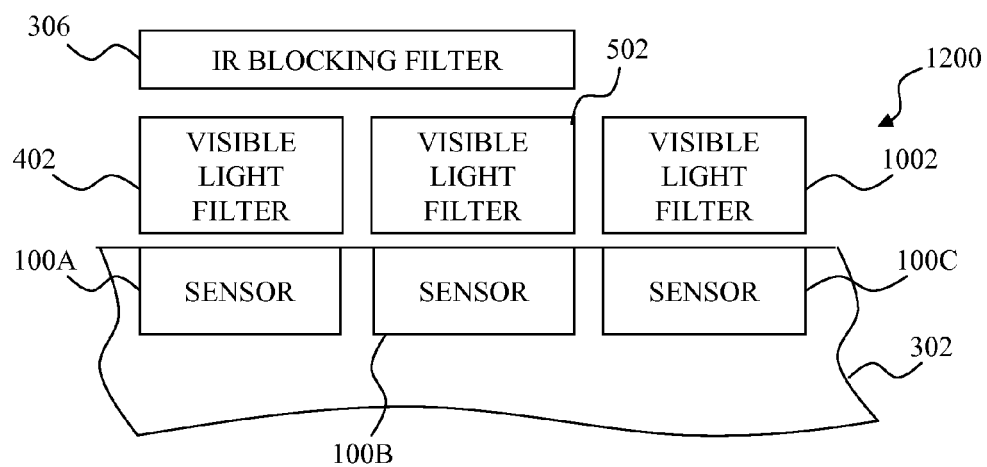
FIG. 12 illustrates one embodiment of a semiconductor device with a non-integrated IR filter positioned above visible light filters and sensors.

Referring to FIG. 12, one embodiment of a device 1200 is illustrated that may have filtering and sensing characteristics that are similar or identical to those of the semiconductor device 1100 of FIG. 11. However, in the device 1200, the IR blocking filter 306 and/or one or more of the visible light filters 402, 502, and 1002 (if present) may be separate from the device. Furthermore, the IR blocking filter 306 is illustrated as positioned above the visible light filters 402, 502, and 1002. Accordingly, it is understood that many different configurations of IR blocking filters 306 and/or visible light filters 402, 502, and 1002 may be used to accomplish the filtering and sensing as described herein.

Figure 13A:
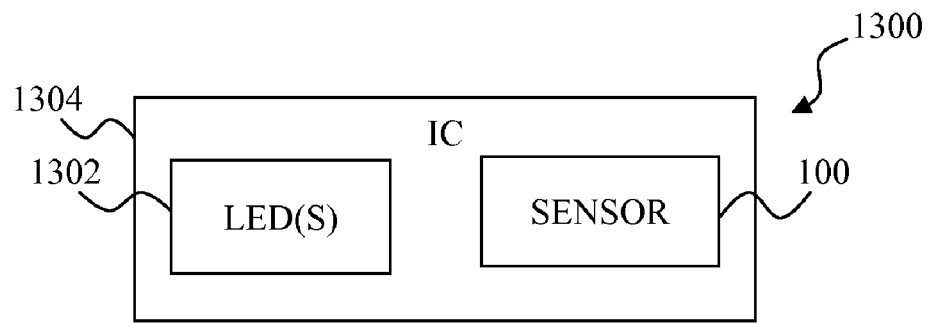
FIG. 13A is a simplified diagram of a top view of one embodiment of an integrated circuit (IC) having an emitter and a sensor positioned thereon.
Figure 13B:
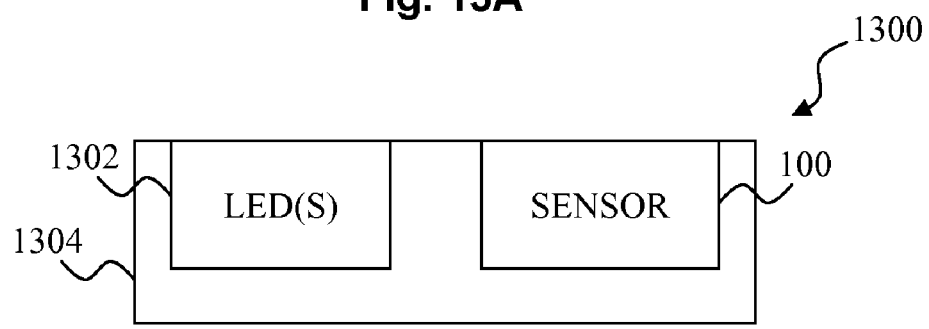
FIG. 13B is a side view of the IC of FIG. 13A.

Referring to FIGS. 13A and 13B, one embodiment of an integrated circuit (IC) 1300 is illustrated that may incorporate one or more semiconductor devices such as one of the devices of FIGS. 3-11 and/or a similar device having a semiconductor sensor structure and an IR blocking filter. As used in the present disclosure, the term "IC" may refer to a single silicon substrate or multiple silicon substrates, and/or may include one or more chips (e.g., may be a packaged single chip or multi-chip module). The IC 1300 may also include compensation circuitry in some embodiments. The IC 1300 includes an emitter 1302 such as a light emitting diode (LED) and the sensor 100 of FIG. 1. It is understood that the emitter 1302 may be any type of emitter capable of producing a signal of any wavelength. The sensor 100 may include one or more sensors capable of sensing the signal produced by the emitter 1302. The LED 1302 and sensor 100 may be positioned within, on, or otherwise located relative to a substrate 1304. For example, one or both of the LED 1302 and sensor 100 may be manufactured separately from the substrate 1302 and later attached thereto if the substrate is a circuit board. In another example, one or both of the LED 1302 and sensor 100 may be created within the substrate 1304.

The LED 1302 may be any LED capable of producing visible or non-visible light of a desired wavelength, such as wavelengths in the visible spectrum in the range of approximately 400 nm to 700 nm or in the IR spectrum in the range of approximately 700 nm to 1100 nm. It is understood that the wavelength range of the LED 1302 may vary depending on the particular application for which it is to be used. For example, the LED 1302 may be configured to emit light in the IR spectrum for a proximity sensing application, but may be configured to emit light in the visible light spectrum for a reflective color sensing application. The LED 1302 may be fabricated directly onto the IC 1300 or may be an IC chip or other modular component that is added to the IC 1300 during or after fabrication of the IC 1300. The LED 1302 may be a single LED or may represent an LED array having LEDs configured to emit light of the same or different wavelengths.

The sensor 100 may be configured to detect light of the wavelength produced by the LED 1302 (e.g., in the visible light spectrum and/or the IR spectrum) and/or light present in the environment (e.g., ambient light). The sensor 100 may be a single sensor or may represent a sensor array. In some embodiments, the sensor 100 may represent multiple sensors, with one or more sensors configured to detect light emitted by the LED 1302, and one or more other sensors configured to detect light present in the environment. The sensor 100 may be fabricated directly onto the IC 1300 or may be an IC chip or other modular component that is added to the IC 1300 during or after fabrication of the IC 1300.

The substrate 1304 provides a structure upon which the LED 1302 and sensor 100 may be mounted or within which they may be formed. The substrate 1304 may be provided by any suitable material, such as a printed circuit board, a metal lead frame, a ceramic structure, and/or other materials. Although not shown, it is understood that one or more layers or other components may be positioned between the substrate 1304 and the LED 1302 and sensor 100, and that the LED 1302 and sensor 100 may not be directly coupled to the substrate 1304.

Figure 13C:
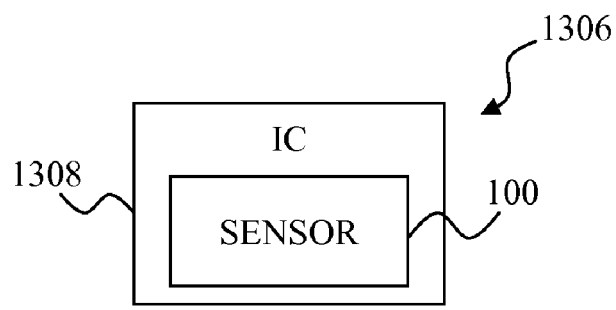
FIG. 13C is a simplified diagram of a top view of one embodiment of an IC having a sensor positioned thereon.
Figure 13D:
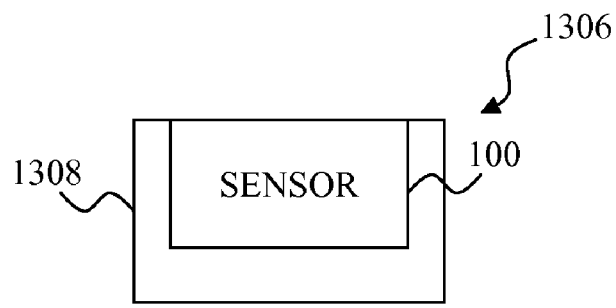
FIG. 13D is a side view of the IC of FIG. 13C.

Referring to FIGS. 13C and 13D, one embodiment of an IC 1306 is illustrated with the sensor 100 of FIG. 1 and a substrate 1308. The IC 1306 may include any of the semiconductor device embodiments described herein, as well as the compensation circuitry in some embodiments. In embodiments such as that illustrated in FIGS. 13C and 13D, the emitter 1302 of FIG. 13A is not present as the sensor 100 may not require an artificial light source but may operate solely on light present in the environment. In other embodiments, the sensor 100 may be manufactured separately from the emitter 1302 and later combined with the emitter on a circuit board or other base layer. It is understood that the sensor 100 may be a single sensor or a sensor array.

Figure 14A:
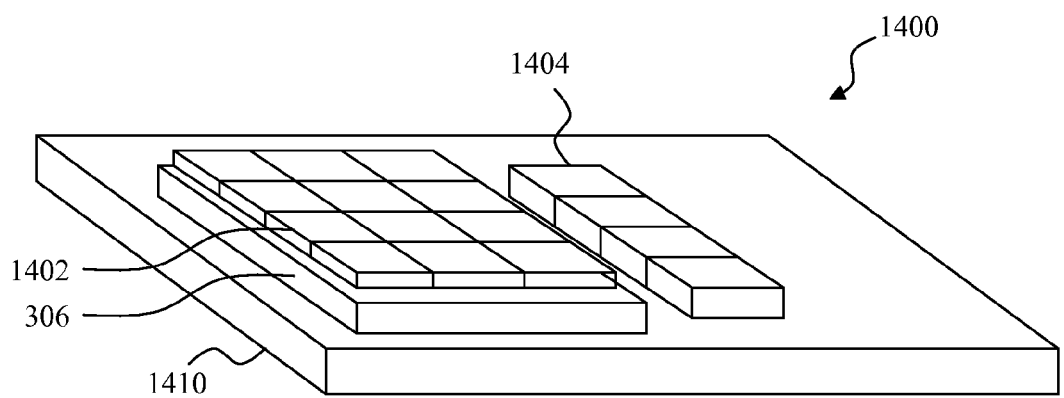
FIGS. 14A and 14B illustrate one embodiment of a semiconductor device having multiple filter arrays.
Figure 14B:
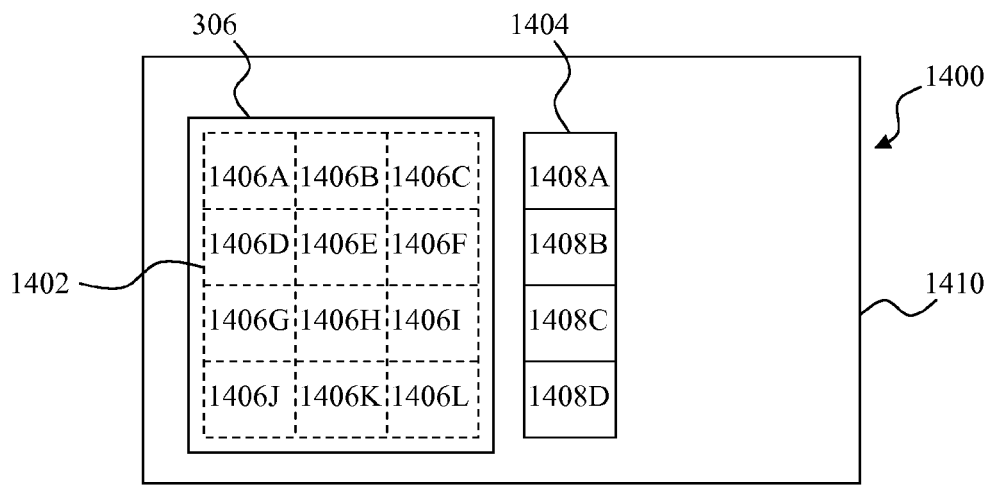
Figure 14C:
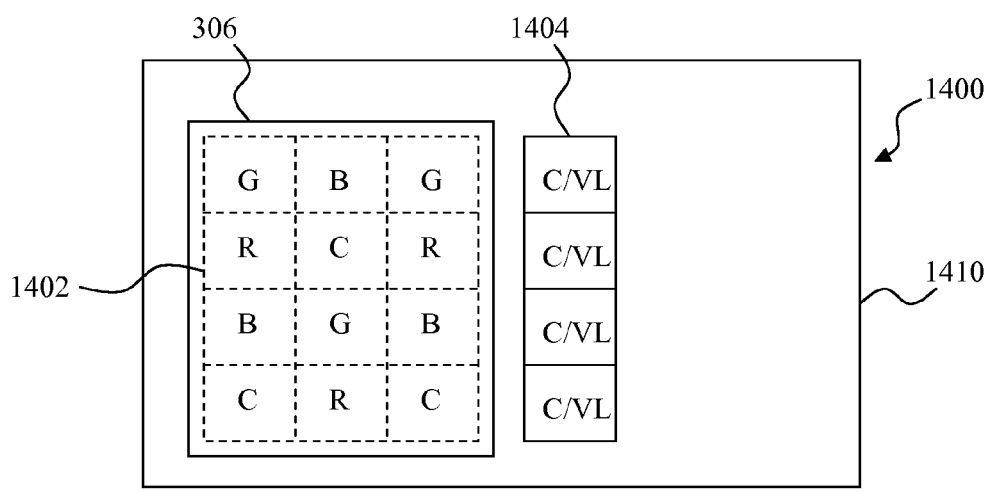
FIG. 14C illustrates one embodiment of a possible configuration of the semiconductor device of FIGS. 14A and 14B.

Referring to FIGS. 14A-14C, one embodiment of a device 1400 is illustrated in a perspective view (FIG. 14A) and top views (FIGS. 14B and 14C). The device 1400 may be an embodiment of the sensor(s) 100 of FIG. 1 or the IC 1300/ 1306 of FIGS. 13A and 13C. The device 1400 is illustrated with a substrate 1410, which may be the substrate 102, 302, 1304, or 1308. A first sensor array (not shown) is positioned in or on the substrate 1410 as described previously. The first sensor array includes sensors 100 and may be configured as an array that is four sensors high and three sensors wide (i.e., a 4×3 array). A second sensor array (not shown) includes sensors 100 and may be configured as a 4×1 array.

The first sensor array is associated with a filter array 1402 as illustrated. As shown in FIG. 14B, the filter array 1402 includes filter positions 1406A-1406L, although it is understood that the filter positions may be clear. For example, each filter position 1406A-1406L represents a position over a sensor that contains a visible light filter, a clear layer, or no layer at all, depending on the manufacturing process used to create the device 1400 and the desired configuration of the device 1400. The previously described IR blocking filter 306 is positioned under the filter array 1402. The second sensor array is associated with a filter array 1404, which includes filter positions 1408A-1408D. As with the filter array 1402, each filter 1408A-1408D of the filter array 1404 represents a position over a sensor that contains a visible light filter, a clear layer, or no layer at all. The filter array 1404 does not have a corresponding IR blocking filter 306.

Referring specifically to FIG. 14C, a specific embodiment of the filter arrays 1402 and 1404 of the device 1400 is illustrated. In the present example, the filter positions 1406A-1406L are associated with a color, with "G" indicating a green filter, "B" indicating a blue filter, "R" indicating a red filter, and "C" representing a position that is clear. It is understood that the illustrated arrangement and color selections are for purposes of example only and may be rearranged in many different ways. Furthermore, one or more of the filter positions 1406A-1406L may represent a filter stack having multiple filters arranged vertically.

The filter positions 1408A-1408D are associated with "C/VL" which represents that the position is either clear or has a visible light filter associated therewith. The underlying sensors may be used for IR detection applications, such as proximity sensing or motion detection. Because the IR blocking filter 1504 does not cover the filter array 1404, the underlying sensors may receive more IR light than those underlying the filter array 1402.

Figure 14D:
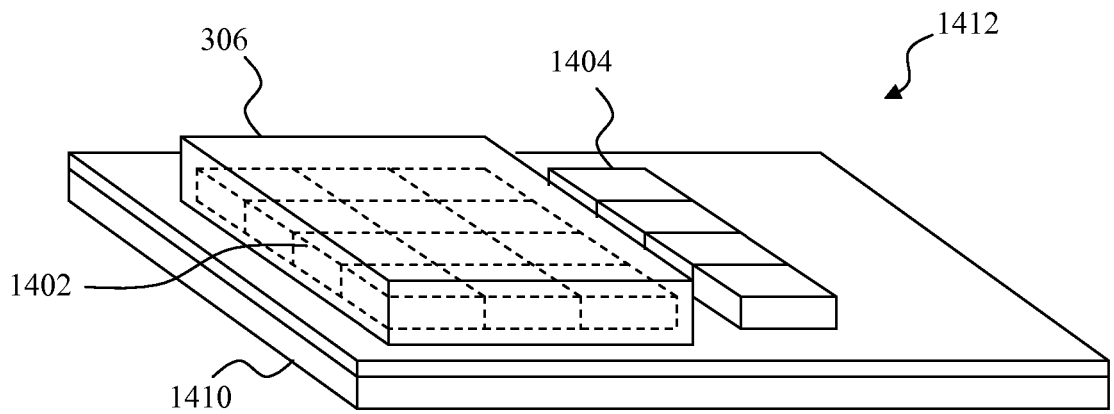
FIG. 14D illustrates another embodiment of the semiconductor device of FIG. 14A.

Referring to FIG. 14D, one embodiment of a semiconductor device 1412 is illustrated in a perspective view. The device

1412 may be an alternate embodiment of the device 1400 of FIG. 14A. In the present example, the IR blocking filter 306 is positioned over the filter array 1402, rather than under the filter array as illustrated in FIG. 14A.

It is understood that additional layers may be present on the devices 1400 and/or 1412, such as the layer 304 and/or sealant layer 308 of FIG. 3. Furthermore, various metal traces and other components may be present that are not shown. In some embodiments, circuitry may be present for performing compensation processes such as those described in previously incorporated U.S. Pat. No. 6,596,981 and U.S. patent application Ser. No. 12/425,530.

Figure 15:
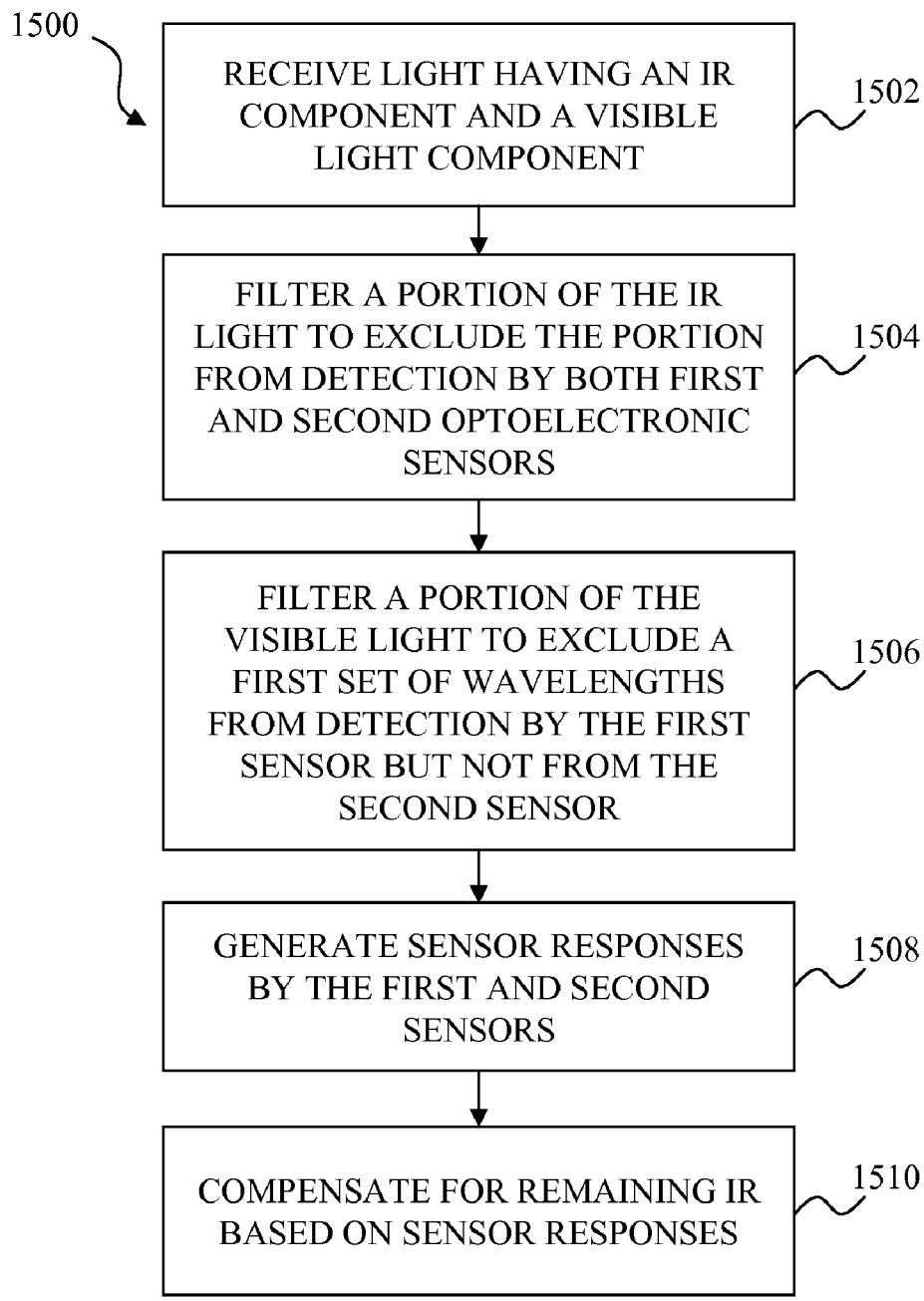
FIG. 15 is a flow chart illustrating one embodiment of a method that may be used for filtering incoming light and performing post-detection compensation.

Referring to FIG. 15, one embodiment of a method 1500 is illustrated that may be used to combine IR filtering with post-detection compensation. The method 1500 may be used with the various embodiments of semiconductor devices and/or ICs described previously, as well as other embodiments not explicitly described herein. For example, the method 1500 may be used with any light detecting device having IR filtering and post-detection compensation capabilities. The post-detection compensation process may be used for many different purposes, such as compensation for an IR light component that was not entirely filtered out prior to detection in order to more accurately identify an approximate photopic response.

In step 1502, a semiconductor device having first and second optoelectronic sensors (e.g., the sensors 100) receives light having an IR light component and a visible light component. For example, the receiving may occur when the light strikes an outer surface of an upper filter layer or another part of the semiconductor device. It is understood that the sensors may also detect other wavelengths (e.g., UV light) that form part of the received light, but these additional wavelengths are ignored in the present example. In other embodiments, the method 1500 may account for UV wavelengths through filtering to remove some or all of the UV light and/or through post-detection compensation.

In step 1504, the received light passes through an IR blocking filter (e.g., the IR blocking filter 306). The IR blocking filter filters a portion of the IR light component from the received light. This excludes the filtered portion of the IR light from detection by the first and second optoelectronic sensors. In step 506, the received light passes through a visible light filter (e.g., the visible light filter 402) either before or after it passes through the IR blocking filter. The visible light filter filters a portion of the visible light component to exclude a first set of visible light wavelengths from detection by the first optoelectronic sensor. The first set of visible light wavelengths is not filtered for the second optoelectronic sensor.

In step 1508, first and second sensor responses are generated by the first and second optoelectronic sensors. The first and second sensor responses represent the received light detected by the first and second optoelectronic sensors after the IR light portion and the first set of visible light wavelengths are filtered. For example, each of the first and second responses may be a photocurrent generated by wells forming the first and second optoelectronic sensors. In step 510, at least one calculation is performed based on the first and second sensor responses to compensate for IR light remaining after filtering the IR light portion. For example, the compensation calculation may be performed as described in previously incorporated U.S. Pat. No. 6,596,981 and/or U.S. patent application Ser. No. 12/425,530.

In other embodiments, a third sensor may be used to detect the received light without IR filtering. Such a sensor may be used to generate a response for purposes such as IR compensation, proximity sensing, motion detection, and/or other applications that may benefit from receiving a stronger IR light component than the first and second sensors.

Figure 16:
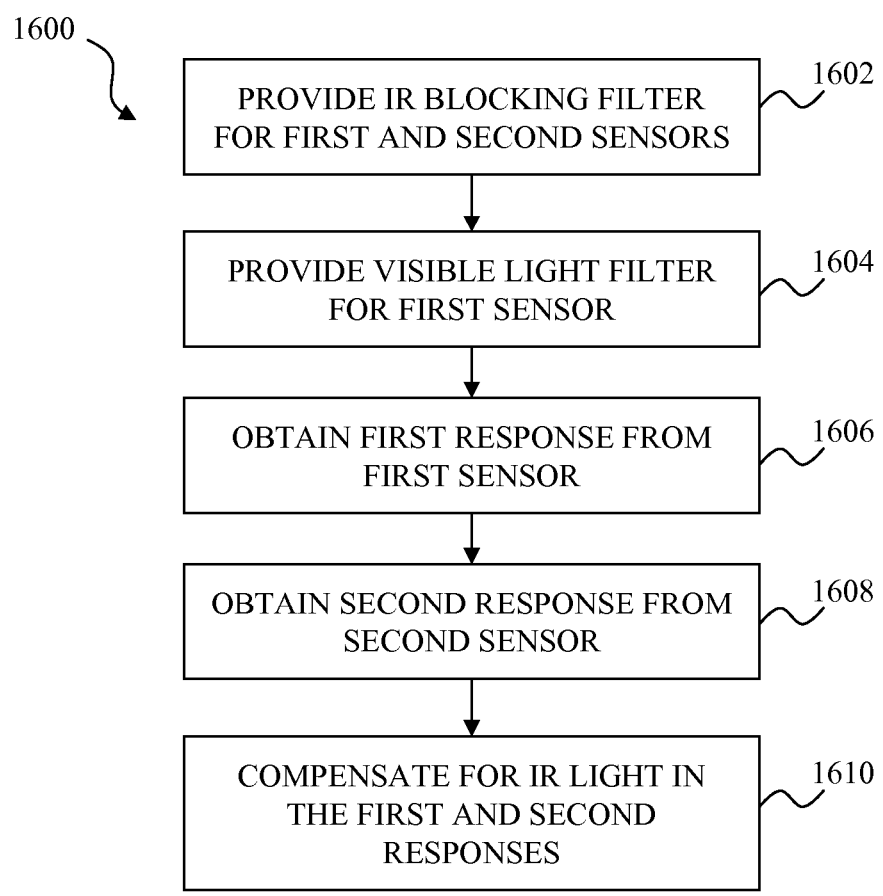
FIG. 16 is a flow chart illustrating one embodiment of a method that may be used for filtering incoming light and performing post-detection compensation.

Referring to FIG. 16, one embodiment of a method 1600 is illustrated that may be used to combine IR filtering with post-detection compensation. The method 1600 may be used with the various embodiments of semiconductor devices and/or ICs described previously, as well as other embodiments not explicitly described herein. For example, the method 1600 may be used with any device having IR filtering and post-detection compensation capabilities. The post-detection compensation process may be used for many different purposes, such as compensation for an IR light component that was not filtered out prior to detection in order to more accurately identify an approximate photopic response.

In step 1602, an IR blocking filter (e.g., the IR blocking filter 306) may be provided. The IR blocking filter is configured to block a first portion of IR light and to let a second portion of the IR light pass through. The IR blocking filter is positioned over first and second optoelectronic sensors to block the first portion of IR light from reaching the first and second optoelectronic sensors. In step 1604, a visible light filter (e.g., the visible light filter 402) may be provided. The visible light filter is configured to block a first portion of visible light and to let a second portion of the visible light pass through. The visible light filter is positioned over the first optoelectronic sensor to block the first portion of visible light from reaching the first optoelectronic sensor and is not positioned over the second optoelectronic sensor.

In step 1606, a first response is obtained from the first optoelectronic sensor. The first response represents at least part of the second portion of the visible light and at least part of the second portion of the IR light detected by the first optoelectronic sensor. In step 1608, a second response is obtained from the second optoelectronic sensor. The second response represents at least part of the first and second portions of the visible light and at least part of the second portion of the IR light detected by the second optoelectronic sensor. In step 1610, compensation is performed for the IR light in the first and second responses to approximate a photopic response.

It will be appreciated by those skilled in the art having the benefit of this disclosure that this method and device for an optoelectronic sensor with an IR blocking filter with compensation processing provides improved detection functionality. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A method comprising:
    receiving, by a semiconductor device having first and second optoelectronic sensors formed therein, light having an infrared (IR) light component and a visible light component;
    filtering a portion of the IR light component from the received light using an IR blocking filter to exclude the filtered portion of the IR light from detection by the first and second optoelectronic sensors;

filtering a portion of the visible light component using a first visible light filter to exclude a first set of visible light wavelengths from detection by the first optoelectronic sensor, wherein the first set of visible light wavelengths is not filtered for the second optoelectronic sensor;

generating first and second sensor responses by the first and second optoelectronic sensors, respectively, wherein the first and second sensor responses represent the received light detected by the first and second optoelectronic sensors after filtering the IR light portion and the first set of visible light wavelengths;

performing at least one calculation based on the first and second sensor responses to compensate for IR light remaining after filtering the IR light portion; and generating a third sensor response by a third sensor of the semiconductor device, wherein the third response represents the IR light component without filtering by the IR blocking filter.

2. The method of claim 1 further comprising filtering a second set of visible light wavelengths from the received visible light using a second visible light filter to exclude the second set of visible light wavelengths from detection by both the first and second optoelectronic sensors.

3. The method of claim 2 wherein the compensating includes determining a difference between the first and second sensor responses.

4. The method of claim 1 further comprising filtering a second set of visible light wavelengths from the received visible light using a second visible light filter to exclude the second set of visible light wavelengths from detection by one of the first and second optoelectronic sensors, wherein the second first set of visible light wavelengths is not filtered for the other of the first and second optoelectronic sensors.

5. The method of claim 1 further comprising filtering a portion of the visible light using a second visible light filter to exclude a second set of visible light wavelengths from detection by the third optoelectronic sensor.

6. The method of claim 1 wherein excluding the first set of visible light wavelengths includes blocking all visible light from an upper surface of the first optoelectronic sensor facing the first visible light filter.

7. The method of claim 6 wherein the compensating is based on the first sensor response representing only a first detectable set of wavelengths of the IR light received by the first optoelectronic sensor due to wavelength dependent absorption of the IR light, and on the second sensor response representing a second detectable set of wavelengths that is larger than the first detectable set of wavelengths and includes the first detectable set of wavelengths, and wherein the first detectable set of wavelengths is biased to longer wavelengths than the remainder of the second detectable set of wavelengths.

8. A method comprising:
providing a first IR blocking filter configured to block a first portion of IR light and to let a second portion of the IR light pass through, wherein the first IR blocking filter is positioned over a first optoelectronic sensor and a second optoelectronic sensor to block the first portion of IR light from reaching the first and second optoelectronic sensors;

providing a first visible light filter configured to block a first portion of visible light and to let a second portion of the visible light pass through, wherein the first visible light filter is positioned over the first optoelectronic sensor to block the first portion of visible light from reaching the first optoelectronic sensor and is not positioned over the second optoelectronic sensor;

obtaining a first response from the first optoelectronic sensor representing at least part of the second portion of the visible light and at least part of the second portion of the IR light detected by the first optoelectronic sensor;

obtaining a second response from the second optoelectronic sensor representing at least part of the first and second portions of the visible light and at least part of the second portion of the IR light detected by the second optoelectronic sensor;

obtaining a third response from a third optoelectronic sensor of the semiconductor device having no IR blocking filter associated therewith; and compensating for the IR light in the first and second responses to approximate a photopic response.

9. The method of claim 8 further comprising providing a second visible light filter configured to block part of the second portion of visible light and to let a third portion of the visible light pass through, wherein the second visible light filter is positioned over the first and second optoelectronic sensors.

10. The method of claim 9 wherein compensating for the IR light includes determining a difference between the first and second sensor responses.

11. The method of claim 8 wherein compensating for the IR light includes determining a ratio between the first and second responses, wherein the ratio represents a spectral response.

12. The method of claim 8 further comprising providing a second visible light filter configured to block part of the second portion of visible light and to let a third portion of the visible light pass through, wherein the second visible light filter is positioned over the second optoelectronic sensor and not the first optoelectronic sensor.

13. The method of claim 8 further comprising providing a second visible light filter positioned over the third optoelectronic sensor and not over the first and second optoelectronic sensors, wherein the second visible light filter is configured to exclude a portion of the visible light from detection by the third optoelectronic sensor.

14. A device comprising:
a first optoelectronic sensor configured to detect electromagnetic radiation in the visible light spectrum and the infrared (IR) spectrum and to generate a first response representing a spectral content of the detected electromagnetic radiation;

a second optoelectronic sensor configured to detect electromagnetic radiation in the visible light spectrum and the IR spectrum and to generate a second response representing a spectral content of the detected electromagnetic radiation;

an IR blocking filter integral to the device and positioned above the first and second optoelectronic sensors, wherein the IR blocking filter is configured to attenuate electromagnetic radiation in the IR spectrum;

a visible light filter integral to the device and positioned above the first optoelectronic sensor, wherein the visible light filter is configured to attenuate electromagnetic radiation that falls within a first portion of the visible light spectrum; and a third optoelectronic sensor configured to detect electromagnetic radiation in the visible light spectrum and the IR spectrum and to generate a third response representing a spectral content of the detected electromagnetic radiation, wherein the third optoelectronic sensor is not associated with any IR blocking filter.

15. The device of claim 14 further comprising a second visible light filter integral to the device and positioned above the first and second optoelectronic sensors, wherein the second visible light filter is configured to attenuate electromagnetic radiation that falls within a second portion of the visible light spectrum.

16. The device of claim 15 further comprising circuitry for generating a differential response by determining a difference between the first and second responses, wherein the differential response represents a photopic response.

17. The device of claim 15 further comprising a third visible light filter positioned above the third optoelectronic sensor, wherein the third visible light filter is configured to attenuate electromagnetic radiation that falls within a third portion of the visible light spectrum.

18. The device of claim 17 wherein the third portion of the visible light spectrum overlaps at least one of the first and second portions of the visible light spectrum.

19. The device of claim 14 wherein a semiconductor layer overlays the first and second optoelectronic sensors, and wherein the IR blocking filter directly overlays the semiconductor layer.

20. A device comprising:
   a first optoelectronic sensor configured to detect electromagnetic radiation in the visible light spectrum and the infrared (IR) spectrum and to generate a first response representing a spectral content of the detected electromagnetic radiation;
   a second optoelectronic sensor configured to detect electromagnetic radiation in the visible light spectrum and the IR spectrum and to generate a second response representing a spectral content of the detected electromagnetic radiation;
   an IR blocking filter integral to the device and positioned above the first and second optoelectronic sensors, wherein the IR blocking filter is configured to attenuate electromagnetic radiation in the IR spectrum; and
   a visible light filter integral to the device and positioned above the first optoelectronic sensor, wherein the visible light filter is configured to block all visible light and wherein the device further comprises circuitry for determining a ratio between the first and second responses, wherein the ratio represents a spectral response; and
   a third optoelectronic sensor configured to detect electromagnetic radiation in the visible light spectrum and the IR spectrum and to generate a third response representing a spectral content of the detected electromagnetic radiation, wherein the third optoelectronic sensor is not associated with any IR blocking filter.

21. The device of claim 20 wherein the second response represents a plurality of wavelengths, and wherein the first response represents only longer wavelengths present in the second response.

22. The device of claim 20 further comprising a second visible light filter integral to the device and positioned above the third optoelectronic sensor, wherein the second visible light filter is configured to attenuate electromagnetic radiation wavelengths that fall within a sub-portion of the visible light spectrum.

* * * * *